(12) United States Patent
Montano et al.

(10) Patent No.: US 6,743,303 B2
(45) Date of Patent: Jun. 1, 2004

(54) PROCESS FOR TREATING ADHESION PROMOTED METAL SURFACES WITH AN ORGANO-SILCON POST-TREATMENT

(75) Inventors: Joseph R. Montano, Boston, MA (US); John P. Cahalen, Arlington, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 169 days.

(21) Appl. No.: 10/003,625

(22) Filed: Nov. 2, 2001

(65) Prior Publication Data

US 2002/0132056 A1 Sep. 19, 2002

Related U.S. Application Data

(60) Provisional application No. 60/245,296, filed on Nov. 2, 2000.

(51) Int. Cl.[7] .............................................. C23C 22/82
(52) U.S. Cl. ..................... 148/256; 148/257; 148/268; 148/276; 148/279; 148/282
(58) Field of Search ................................ 148/256, 257, 148/268, 276, 279, 282

(56) References Cited

U.S. PATENT DOCUMENTS

| 5,622,782 | A | | 4/1997 | Poutasse, III et al. |
| 5,861,076 | A | * | 1/1999 | Adlam et al. ................ 156/281 |
| 5,885,436 | A | * | 3/1999 | Ameen et al. ............... 205/194 |
| 6,054,061 | A | * | 4/2000 | Bayes et al. .................. 216/13 |

FOREIGN PATENT DOCUMENTS

| JP | H4-162668 | 6/1992 |
| WO | WO 01/49805 A1 | 7/2001 |

* cited by examiner

*Primary Examiner*—Andrew L. Oltmans
(74) *Attorney, Agent, or Firm*—John J. Piskorski

(57) ABSTRACT

A method for treating a micro-roughened metal surface to improve bonding between the metal surface and a polymer material. The method involves post-treating the micro-roughened conversion coated metal surface with an aqueous organo-silicon wetting composition after having formed the micro-roughened conversion coated metal surface with an adhesion promotion composition. Suitable organo-silicons include organosilanes, organosiloxanes, organosilizanes and the like. The method can be employed in the circuit board industry to improve bonding between layers in multilayer circuit boards.

44 Claims, No Drawings

PROCESS FOR TREATING ADHESION PROMOTED METAL SURFACES WITH AN ORGANO-SILCON POST-TREATMENT

This application claims the benefit of U.S. Provisional Application No. 60/245,296 filing date Nov. 2, 2000

BACKGROUND OF THE INVENTION

The present invention is directed to a method of improving adhesion between metal and polymeric materials. More specifically, the present invention is directed to a method of improving adhesion between metal and polymeric materials by treating the metal with an aqueous organo-silicon wetting agent following an adhesion promotion step.

Printed circuits containing one or more circuitry innerlayers are in prominent use today as demand increases for further and further weight and space conservation in electronic devices.

In a fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern. One or more circuitry innerlayers of any particular type or types of circuitry pattern, as well as circuitry innerlayers which might constitute ground planes and power planes, are assembled into a multilayer circuitry by interposing one or more partially-cured dielectric substrate material layers (so called "pre-preg" layers) between the circuitry innerlayers to form a composite of on alternating circuitry innerlayers and dielectric substrate material. The composite is then subjected to heat and pressure to cure the partially cured substrate material and achieve bonding of circuitry innerlayers thereto. The cured composite will then have a number of through holes drilled there through, which are then metallized to provide a means for conductively interconnecting all circuitry layers. In the course of the through hole metallizing process, desired circuitry patterns will also typically be formed on the outer facing layers of the multilayer composite.

An alternate approach to the formation of a multilayer printed circuit board is through additive or surface laminar circuitry techniques. These techniques begin with a non-conductive substrate, upon which the circuit elements are additively plated. Further layers are achieved by repeatedly applying an imageable coating upon the circuitry and plating further circuit elements upon the imageable coating.

It has long been known that the strength of the adhesive bond formed between the copper metal of the circuitry innerlayers and the cured pre-preg layers, or other non-conductive coatings, in contact therewith is a common failure point. The result is that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed by A. G. Osborne, "An Alternate Route To Red Oxide For Inner Layers", PC Fab. August, 1984, as well as variations involving direct formation of red oxide adhesion promoter, with varying degrees of success being obtained. The most notable improvement in this art is represented in the U.S. Pat. Nos. 4,409,037 and 4,844,981 to Landau, the teachings both of which are incorporated herein by reference in their entirety, involving oxides formed from relatively high chlorite/relatively low caustic copper oxidizing compositions, and producing substantially improved results in circuitry inner layer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive effort in seeking to arrive at a multilayer printed circuit fabrication process that is not susceptible to such localized delamination. One suggested approach has been to provide the adhesion promoting copper oxide as a thick coating so as to retard its dissolution in subsequent processing simply by virtue of sheer volume of copper oxide present. This turns out to be essentially counter-productive, however, because the thicker oxide coating is inherently less effective as an adhesion promoter per se. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g., through-hole metallization), thereby minimizing pink ring/delamination possibilities.

U.S. Pat. No. 4,642,161 to Akahoshi et al., U.S. Pat. No. 4,902,551 to Nakaso et al., and U.S. Pat. No. 4,981,560 to Kajihara et al., and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e. (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multilayer assembly employing such circuitry innerlayers will not evidence pink ring formation since there is no copper oxide present for localized dissolution, and localized exposure of underlying copper, in subsequent through-hole processing. Here again, however problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings of which are incorporated herein by reference in their entirety, reveals a process whereby an adhesion promotion layer of copper oxide is formed on the circuit elements followed by a controlled dissolution and removal of a substantial amount of the copper oxide in a manner which does not adversely affect the topography.

PCT Application No. WO96/19097 to McGrath, the teachings of which are incorporated by reference herein in their entirety, discusses a process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

U.S. Pat. No. 5,869,130, to Ferrier entitled "Process For Improving Adhesion of Polymeric Materials to Metal Surfaces" describes a process for improving the adhesion of polymeric materials to a metal surface, especially copper or copper alloy surfaces in the production of multilayer printed circuits. The process described in this patent application provides for contacting the metal surface with an adhesion-promoting composition comprising (a) an oxidizer; (b) an acid;(c) a corrosion inhibitor; (d) a source of halide ions; and (e) optionally, a water soluble polymer. That process provided excellent adhesion between the metallic and polymeric surfaces (i.e. the circuitry and the intermediate insulating layer), while eliminating or minimizing pink ring and operating economically, as compared to above noted conventional processes.

However, it has been found that the use of acidic peroxide treatment solutions, while giving good peel strength and stability of copper laminated to fiberglass filled resin, allows the occurrence of some flaws on further processing of the laminated board to create a finished printed circuit board. Thus, with some resin systems, particularly lower Tg materials, drilling removes a small quantity of organic material from the surface of the etch treated copper at the point where the drill intersects with the copper layer; this phenomenon is called "wedge". Further processing the drilled board through the chemical steps of preparing and plating the board creates a small area at the treated copper surface around the drilled hole where the coating is attacked and removed, creating a phenomenon called "pink ring". This area of pink ring is much smaller than the pink ring observed in standard oxide processing to prepare copper surfaces for lamination. Nevertheless, in this area of attack small areas of resin contracting from the copper surface can be observed after floating the board in molten solder. Although these areas of resin contraction (called "resin voids") may not be sufficient cause for rejection of the board they are still a concern.

In particular, it has been found that these wedge, pink ring and resin void flaws can be greatly reduced or eliminated by processing the board treated with these acidic peroxide treatment solutions through a strongly alkaline post treatment, followed by rinsing and drying.

U.S. Pat. No. 6,020,029 to Ferrier et al. discloses an acidic peroxide, adhesion promotion composition containing an oxidizer, an acid, a corrosion inhibitor, optionally a source of halide ions and optionally a water soluble polymer. Preferably, the water-soluble polymer is not a wetting agent or surfactant, but a water soluble homopolymer or copolymer of low molecular weight. The composition is applied to a metal surface. After the acidic peroxide solution is applied to the metal, the metal is post-treated with a strong alkaline solution followed by rinsing with water. After the metal is post-treated, a polymeric material is bonded to the metal surface. The '029 patent alleges that the combination of the halide and water soluble polymer in the acidic peroxide composition provide the best bonding results between the metal surface and the polymeric material.

WO 00-02426 discloses another method for addressing bond integrity between a metal surface and a polymeric coating. The method disclosed in the WO 00-02426 patent is to convert cupric-based organometallic compounds into cuprous-based organometallic conversion coatings to improve bonding integrity. The process is achieved by reduction and/or by partial dissolution of the organometallic coating, and optionally applying a copper oxidation inhibitor. Reducing agents employed include aminoboranes and dissolution agents include cupric ion chelators, organic or inorganic acids and their salts. Copper oxidation inhibitors include azole derivatives, including halogen substituted derivatives thereof. Cationic, amphoteric, anionic and/or non-ionic surface active agents may be included in the composition to enhance the effectiveness of the composition.

Although there are numerous methods directed to improving the bonding integrity between a metal surface and a polymeric material, there is still a need in the circuit board industry for a process that improves the adhesive properties between the metal and the polymeric material.

SUMMARY OF THE INVENTION

The present invention is directed to a process and composition for improving the adhesion between a metal surface and a polymeric material by treating the metal surface with an adhesion promotion composition followed by contacting the treated metal surface with an aqueous organo-silicon wetting composition. The aqueous organo-silicon wetting composition makes the micro-roughened, i.e. nooks and crannies, metal surface more accessible to contact with a polymeric material to be coated on the metal surface. After the treated metal surface is post-treated with the aqueous organo-silicon wetting composition, the polymeric material is placed on the surface of the metal to form a high integrity bond between the metal surface and the polymer material. Organo-silicon compounds that may be employed to practice the present invention include any silicon compound with organic substituents that assists in bonding a polymeric material to a micro-roughened metal surface.

Advantageously, the method and composition of the present invention provide for improved adhesion between a metal surface and a polymeric material as compared with known adhesion promoting processes. Accordingly, the adhesion between the metal surface and the polymeric material is such that multilayer circuit boards prepared using the method of the present invention do not readily delaminate when exposed to harsh and corrosive chemicals, or high temperatures during board manufacturing steps.

More importantly, the aqueous organo-silicon composition post-treatment of the present invention prolongs the life of the final product. Multilayer circuit boards post-treated in accordance with the present invention and installed in electronic equipment do not delaminate as readily over time as multilayer circuit boards that were not post-treated. Thus the electronic products have an improved life.

Also, the post-treatment method of the present invention may be employed with many different adhesion promotion treatments to further improve adhesion between a metal surface and a polymeric material. Thus the process of the present invention is a readily available means for improving the adhesion promoting methods known in the circuit board industry.

An objective of the present invention is to provide a means of improving the adhesion integrity between a metal surface and a polymeric material.

Another objective is to provide improved peel strength between a metal surface and a polymeric coating.

An additional objective of the present invention is to provide a multilayer circuit board that prolongs the life of electronic devices in which it is employed.

A further objective of the present invention is to provide a method of improving adhesion between a metal surface and a polymeric material that can be employed to improve known adhesion methods.

Still yet another objective of the present invention is to provide both a chemical and mechanical bond between the metal surface and the polymeric material to improve adhesion integrity.

Additional objectives and advantages of the present invention will be apparent to those of skill in the art after reading the following description of the invention and the appended claims.

DETAILED DESCRIPTION OF THE INVENTION

The present invention is directed to a process of employing an aqueous organo-silicon wetting composition to improve the adhesion of a polymeric material with a metal surface. The aqueous organo-silicon wetting composition is employed as a post-treatment step after treating a metal surface with an adhesion promoting composition. The adhesion promoting composition produces a micro-roughened surface, i.e. nooks and crannies, on a metal substrate to provide mechanical bonding with a polymeric material. While not being bound by any particular theory or mechanism, Applicants believe that post-treatment of the metal surface with the aqueous organo-silicon composition permits the organo-silicon compound to penetrate the nooks and crannies to reduce surface tension between the nooks and crannies and the polymer material and/or planarize the metal surface. A suitable organo-silicon compound within the scope of the present invention is a silicon compound having organic constituents, and that may be applied in an aqueous composition in a suitable quantity to provide contact between a polymeric material and the nooks and crannies of a micro-roughened metal surface. Organic constituents include, but are not limited to, alkyl groups, alkenyl groups, aryl groups, alkoxy groups, ethoxy groups, amino groups and the like bonded to tetravalent silicon. The different organic constituents may be unsubstituted or substituted with, for example, halogens, thiol groups, amino groups and the like as further described below.

The present process is particularly suited to the manufacture of multilayer printed circuit boards. Thus, in this application the metal circuitry (usually copper) of the innerlayers is treated with an adhesion-promoting composition. After adhesion promotion treatment, optionally followed by water rinsing, the innerlayers are post-treated with an aqueous organo-silicon wetting composition. Optionally, another rinsing step may be employed before applying the polymer to the metal. If rinsing is employed, the metal surface is preferably air dried before placing the polymer on the metal. The post-treated innerlayers may also be heated prior to placing the polymer to the metal. Heat treatment involves baking the innerlayers to temperatures of from about 30° C. to about 110° C. for about 5 minutes to about 20 minutes. The innerlayers are bonded together with polymeric materials such as pre-pregs or imageable dielectrics, resulting in the multilayer printed circuit board.

The metal surface to be treated may comprise a variety of metals such as copper, nickel, iron and alloys of each of the foregoing. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

As discussed above, any suitable organo-silicon compound may be employed to practice the present invention. Preferred organo-silicon compounds are organosilanes, siloxanes and silazanes.

Organosilane compounds within the scope of the present invention include compounds having the following general formula:

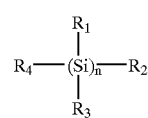

where n is 1 or 2, and
where $R_1$, $R_2$, $R_3$, and $R_4$ are, each independently, an alkyl group of from 1 to 20 carbon atoms, straight chained, branched or cyclic, the alkyl group may be substituted with an alkenyl group of 2 to 8 carbon atoms, a halogen, thiol, cyano, isocyanato, an epoxy group, glycidyl group, an acryloxy group, a primary, secondary, tertiary, or quartenary amino group, or an aryl group, the aryl group may have alkyl substituents of $C_1$ to $C_6$, a $C_1$ to $C_6$ alkoxy, a halogen or a hydroxyl group; an alkenyl group of from 2 to 20 carbon atoms, straight, branched, cyclic, unsubstituted or substituted with a halogen, thiol, cyano, isocyanato, or a primary, secondary or tertiary amino group; an aryl group, unsubstituted or substituted with a halogen, hydroxyl or an alkyl or alkoxy group having 1 to 6 carbon atoms, the alkyl group may be substituted with a halogen, thiol, or primary, secondary, or tertiary amino group; an alkoxy group having from 1 to 6 carbon atoms, unsubstituted or substituted with a halogen, thiol, aryl, or primary, secondary, or tertiary amino group; an epoxy substituted alkyl having from 3 to 12 carbon atoms; an acetamido group having from 2 to 6 carbon atoms; an aceto group having from 2 to 6 carbon atoms; an acetoxy group; an imadazole group; a hydroxyl group; or a primary secondary or tertiary amino group. Halogens that may be employed include bromine, chlorine, or fluorine with chlorine the preferred.

Examples of suitable organosilanes include, but are not limited to, trimethoxysilyl-propylethylene-diamine, trimethoxysilyl-propylene-diamine, triemthoxysilyl-propyldiethylene-triamine, N-methylamino-propyltrimethoxysilane, 3-mercaptopropyltrimethoxysilane, 3-methoxypropyltriethoxysilane, 3-mercaptopropylmethyldimethoxysilane, 2-mercaptoethyltriethoxysilane, 2-mercaptoethylmethyldiethoxysilane, mercaptomethyltrimethoxysilane, 3-mercaptopropyldimethylmethoxysilane, p-(mercaptomethyl)phenyltrimethoxysilane, p-mercaptophenyltrimethoxysilane, 2-(p-mercaptophenyl)ethyldimethoxysilane, 3-mercaptopropylethyldimethoxysilane, 3-mercaptopropylphenyldimethoxysilane, 3-mercaptopropyl(2-phenylethyl)dimethoxysilane, 2-mercaptoethyldimethyl-methoxysilane, 3-mercaptopropyltrimethylsilane, 1,3-mercaptopropyl-trimethoxysilane, 2,4-dimercaptobutylmethyldimethoxysilane, 1,2-dimercaptoethyl-trimethoxysilane, 2-(m,p-dimercaptophenyl)ethyltrimethoxysilane, mercaptomethyldimethylmethoxysilane, 3-mercaptopropyldimethoxysilane, mercaptomethyltrimethylsilane, di(3-mercaptopropyl)dimethoxysilane, 3-mercapto-propyl-2-mercaptoethyldimethoxysilane, 1,2-dimercaptoethyldimethylmethoxysilane, (chloropropyl)trimethoxysilane, 3-chloropropyl-trimethoxysilane, 3-chloropropyl-triethoxysilane, 3-chloropropyl-methyldimethoxysilane, chloromethyl-trimethoxysilane, 2-(3,4-epoxycyclohexyl)ethyl-trimethoxysilane, 1-trimethoxy-2-(chloromethyl)-phenylethane, N-trimethoxysilyl-propyl-N,N,N-tri-methyl ammonium chloride, 3-hydroxy-propyl-trimethoxysilane, propyl-triemthoxysilane, methyl-trimethoxysilane, methyl-triethoxysilane, dimethyl-dimethoxysilane, dimethyl-diethoxysilane, ethyl trimethoxysilane, isobutyl-trimethoxysilane, 3-methacryloxy-propyltri-methoxysilane, diphenyl-diethoxysilane, diphenyl-dimethoxysilane, 3-isocyanatopropyl-triethoxysilane, 2-cyanoethyl-triethoxysilane, 3-glycidoxypropyl-trimethoxysilane, (3-glycidoxypropyl)-methyldiethoxysilane, Di-t-butoxy-diacetoxysilane, ethyl-triacetxoysilane, trimethylsilyl-acetamide, trimethylsilyl-acetate, trimethylsilyl-imadazole, hexamethyl-disilane and the like.

Organosiloxanes and organosilazanes within the scope of the present invention have the following general formula:

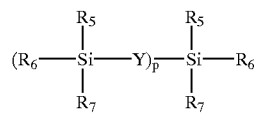

where p is 1 to 6; Y is O, or $NR_8$; where $R_8$ is H, a $C_1$ to $C_8$ alkyl, or a phenyl; and where $R_5$, $R_6$, and $R_7$ are each independently, an alkyl group having from 1 to 20 carbon atoms, branched, unbranched or cyclic, unsubstituted or substituted with halogen, or thiol; an alkenyl group of from 1 to 20 carbon atoms, branched or unbranched, unsubstituted or substituted with a halogen or thiol group; an aryl group, unsubstituted or substituted with an alkyl group or alkoxy group of from 1 to 6 carbon atoms, or a halogen, or hydroxyl group.

Examples of suitable organosiloxanes include, but are not limited to, hexamethyl-disiloxane, 1,3-diphenyl-1,3-dimethyldisiloxane, 1,1,3,3-tetraisopropyl-disiloxane, 1,3-divinyl-tetramethyldisiloxane, 1,1,3,3-tetramethyl disiloxane, 1,1,3,3,5,5-hexamethyl-trisiloxane, or decamethyl-tetrasiloxane.

Organosiloxanes within the scope of the present invention also include cyclic organosiloxanes. Such cyclic organosiloxanes include, but are not limited to, hexamethylcyclotrisiloxane, decamethylcyclopentasiloxane, 1,3,5,7,9-pentamethylhydrocyclopentasiloxane, and the like.

Examples of suitable organosilazanes within the scope of the present invention include, but are not limited to, hexamethyldisilazane, 1,3-diphenyltetramethyldisilazane, 1,3-divinyltetramethyldisilizane, 1,1,3,3,5,5-hexamethylcyclotrisilazane, octamethylcyclotetrasilazane and the like.

Preferred organo-silicon compounds employed to practice the present invention are the organosilanes of which the aminosilanes and the mercaptosilanes are the more preferred. The aminosilanes and mercaptosilanes that are especially preferred have at least one alkoxy moiety in their stucture. While not being bound to any particular theory, such alkoxy moieties are believed to have an affinity for metal, especially copper. The most preferred organo-silicon compounds are the aminosilanes. While the alkoxy moieties of the aminosilanes have an affinity for the metal surface, the amino moieties have an affinity for the polymeric material, thus further enhancing adhesion between the metal and the polymeric material.

The organo-silicon compounds are employed in an aqueous composition in amounts sufficient for a polymeric material to contact the nooks and crannies of a metal surface. The amount of organo-silicon compounds in the composition ranges from about 0.5% by volume to about 25% by volume, preferably from about 5% by volume to about 15% by volume of the composition. Preferably, the aqueous composition contains an organo-silicon compound or a mixture of organo-silicon compounds and water without any other components. Any suitable surfactant may be employed to practice the present invention, if desired, provided that the surfactant does not interfere with the improved adhesion action of the organo-silicon compound. Surfactants are preferably left out of the aqueous wetting composition.

As mentioned above, any suitable adhesion promoting treatment process can be employed provided that the adhesion promoting composition produces a micro-roughened conversion-coated surface upon the metal. Such surfaces are particularly suited to bonding with polymeric material in contrast to non-treated metal surfaces. Such adhesion promoting compositions may contain an oxidizer, an acid and a corrosion inhibitor. Additional components and modifications to such adhesion promoting compositions may be added as discussed below. Such adhesion promoting compositions have pH ranges from about 2.0 to as high as about 13.0.

The oxidizer used in the adhesion-promoting composition may comprise any oxidizer that is capable of oxidizing the metal surface in the matrix of the adhesion-promoting composition. Hydrogen peroxide and persulfates are particularly preferred oxidizers for use in the process of the invention, with hydrogen peroxide being the most preferred oxidizer. The concentration of the oxidizer in the adhesion-promoting composition may range from at least about 0.01% by weight based on the total weight of the composition to as high as about 60.0% by weight. Preferably, the hydrogen peroxide is present from about 0.1% to about 20% by weight, more preferably from 0.5% to about 10%, and most preferably from about 1% to about 5%. Hydrogen peroxide is commercially available as, e.g., 35% by weight in water.

The adhesion-promoting compositions optionally may contain a stabilizing agent for hydrogen peroxide. Any suitable stabilizing agent for hydrogen peroxide may be used. Examples include, but are not limited to, dipicolinic acid, diglycolic acid and thiodiglycolic acid, ethylene diamine tetraacetic acid and its derivatives, magnesium salts of an aminopolycarboxylic acid, sodium silicate, phosphates and sulphonates. Stabilizers are added in amounts of from about 0.001% and preferably at least about 0.005% by weight of the adhesion promotion composition. More preferably, the concentration of the stabilizing agent varies between about 0.5% to about 5.0% by weight of the composition.

The acid utilized in the adhesion-promoting composition may be any acid that is stable in the matrix. Preferred acids are inorganic acids and may be employed as a single acid or a mixture of acids. A variety of inorganic acids may be used including, but not limited to, sulfuric acid, nitric acid, hydrochloric acid, phosphoric acid and mixtures thereof. Sulfuric acid, phosphoric acid, or mixtures thereof is especially preferred. When a mixture of inorganic acids is used, the acids may be combined in any suitable ratio. A ratio of from about 99:1 to about 1:99, and preferably from about 75:25 to about 25:75 may be employed. When a mixture of sulfuric acid and phosphoric acid are used, preferably sulfuric acid is used in major amounts and phosphoric in minor amounts. The concentration of the acid in the adhesion-promoting composition may range from about 5 to about 360 grams per liter, preferably from about 70 to about 110 grams per liter.

The corrosion inhibitor used in the adhesion-promoting composition is a compound that effectively reacts with the metal surface to form a protective complex layer. Preferred corrosion inhibitors are pyrroles, azoles, oxazoles, thiazoles, pyrazoles, triazoles, benzotriazoles, tetrazoles, tolyltriazol, hydroxy-substituted azole compounds, imidazoles, benzimidazoles such as 5-methylbenzimidazole, 2-bromobenzyl benzimidazole, 2-chlorobenzyl benzimidazole, 2-bromophenyl benzimidazole, 2-chlorophenyl benzimidazole, 2-bromophenyl benzimidazole, 2-chloroethylphenyl benzimidazole and 2-undecyl-4-methylimidazole, or mixtures thereof. Hydroxy-substituted azole compounds may have more than one hydroxy substituent and may be further substituted, such as with a $(C_1–C_6)$alkyl, $(C_1–C_6)$alkoxy, halogen and the like. Suitable hydroxy-substituted azole compounds include, but are not limited to, hydroxy-substituted triazoles and hydroxy-substituted tetrazoles. 1-Hydroxybenzotriazole is a preferred hydroxy-substituted triazole. Examples of suitable benzotriazoles include, but are not limited to, benztriazole, carboxybenzoxtriazole and mixtures thereof. The corrosion inhibitors are available from a variety of commercial sources and may be employed without further purification. The concentration of the corrosion inhibitor in the adhesion-promoting composition may range from about 0.1% to about 20% by weight based on the total weight of the composition, preferably from about 0.2% to about 1% by weight, and most preferably from about 0.3% to about 0.6% by weight.

Optionally, a source of halide ions may be employed in the adhesion-promoting compositions. Any suitable source of halides may be employed as long as the source provides halide ions in the matrix of the adhesion-promoting composition. Examples of suitable sources of halide ions are alkali metal salts such as sodium chloride or potassium chloride, oxohalides such as sodium chlorate or potassium chlorate, or halide bearing mineral acids such as hydrochloric acid. The most preferred sources are halide sources that are free of surfactant groups, such as tetraalkyl ammonium halides, such as tetraalkyl ammonium chloride, tetrabutyl ammonium chloride and mixtures thereof. The concentration of the source of halide ions in the adhesion-promoting composition may range from about 1 ppm to about 50 ppm. When chloride is employed, the chloride ion is present in amounts of from about 1 ppm to about 8 ppm, preferably from about 4 ppm to about 7 ppm.

Optionally, the adhesion-promoting composition also comprises a water soluble polymer. The water soluble polymer is a polymer of ethylene oxide, an ethylene oxide-propylene oxide copolymer, polyethylene glycols, polypropylene glycols or polyvinyl alcohols. Among the most preferred are the polymers of ethylene oxide, or polyethylene glycols sold by the Union Carbide company under the tradename Carbowax. Particularly useful are the ethylene oxide polymers or ethylene oxide-propylene oxide copolymers sold by the BASF company under the Pluronic tradename. The concentration of the water soluble polymer in the adhesion-promoting composition can range from 1 to 15 grams per liter, but is preferably from 3 to 6 grams per liter.

An additional component that may be added to the adhesion composition or bath is an amine or a quaternary ammonium compound. The term amine as used herein is defined as a lower aliphatic, cycloaliphatic or aromatic amine, i.e. a primary, secondary or tertiary amine having $C_1$ to $C_8$ substitution. The term quaternary ammonium compound as used herein is also defined as a lower aliphatic, cycloaliphatic or aromatic compound. Each term excludes from its scope materials having fatty substitution or other surfactant groups. Each substituent on the amine may be aliphatic, cycloaliphatic or aromatic and each of such substituents may be further substituted with groups such as carboxyl, nitro, sulfonyl, hydroxyl, and the like. Exemplary amines include methyl amine, dimethylamine, trimethylamine, ethylamine, triethylamine, tripropylamine, isopropylamine, triallylamine, n-butylamine, t-butylamine, n-amylamine, cyclohexylamine, dicyclohexylamine, and the like. Exemplary quaternary ammonium compounds include tetramethylammonium hydroxide, tetraethylammonium hydroxide, and dimethyl-diethylammonium hydroxide, tetramethylammonium chloride, tetraethylammoium chloride and dimethyl-dimethylammonium chloride. The amines are used in a concentration of from about 0.01% by weight to about 2.5% by weight and more preferably, in a concentration of from about 0.1% to about 1.0% by weight.

Prior to adhesion-promotion and the post-treatment step, the metal surface, particularly copper, or a copper alloy surface, preferably is cleaned by mechanical or chemical cleaning and then contacted with the adhesion-promotion composition. The metal surface can be treated with the adhesion-promoting composition in a variety of ways, including immersion, spray, or flood. The temperature of the adhesion-promoting composition during treatment preferably does not exceed 75° C. and more preferably, at a temperature varying between about 20° C. to about 50° C. Contact time is at least about 1 second and preferably between about 5 seconds and about 2 minutes though the maximum contact time may be up to about 10 minutes. A contact time of about 1 minute or less is particularly preferred.

After the metal surface is treated with the adhesion-promoting composition, the metal is spray-coated, dip-coated, roller-coated, squegee-coated and the like with the aqueous organo-silicon compound composition. Such coating methods include both vertical and horozontal methods and apparatus. Contact time between the treated metal and the aqueous organo-silicon composition ranges from about 1 second to about 1 minute, preferably, between about 10 to about 30 seconds. Preferably, the post-treatment is done at a temperature of from about 18° C. to about 22° C. (room temperature). The post-treatment process may be performed at higher temperatures, however, there is no advantage to performing the process at temperatures above room temperature. Optionally, the treated metal may be rinsed with water prior to post-treatment and/or prior to placing the polymer material on the metal surface. The post-treated metal surface also may be air-dried or baked at temperatures of from about 95° C. to about 120° C. for about 5 to about 20 minutes.

The polymer material may be placed on the metal surface to form a bond with the metal surface by any suitable method employed in the art. Mechanical pressure with heat is one method that is very suitable for joining the polymer to the metal surface. The polymer material may be in the form of a polymeric photoresist, screen-resist solder mask, adhesive material and the like.

In another embodiment of the present invention, the metal surface may be treated with an alkaline solution after the acidic oxidant treatment but prior to the aqueous organo-silicon post-treatment. The preferred alkaline solution is an aqueous alkaline solution of alkali metal hydroxide (e.g. sodium hydroxide or potassium hydroxide); alkali metal carbonates (e.g. sodium carbonate or potassium carbonate); alkali metal phosphates (e.g. sodium phosphate or potassium phosphates); or amines or mixtures of those chemicals. The preferred amount of such chemicals in the aqueous solution will depend upon the particular chemical employed as well as the exact use involved. Most preferably an aqueous solution of sodium or potassium hydroxide is used as the alkaline treatment, with the concentration of sodium or potassium hydroxide ranging from about 2 to about 150 grams per liter, most preferably from about 25 to about 50 grams per liter. Contact may be made by immersion, conveyorized flood or spray, however conveyorized flood is preferred. Contact time may range from about 20 seconds to about 10 minutes but about 1 to about 3 minutes is preferred. Contact temperature may range from room temperature to about 85° C. but about 20° C. to about 40° C. are preferred. This alkaline treatment reduces the number of flaws in the finished laminated product. After the alkaline treatment, the metal surface may be rinsed with water. The treated metal surface is then post-treated with the aqueous wetting agent composition and then the metal surface is bonded to polymeric material by any conventional process.

In another embodiment of the present invention, the adhesion-promoting step may be a process for converting cupric-based organometallic compounds on a copper surface into cuprous-based organometallic conversion coatings. Such a process is achieved by reduction and/or by partial dissolution of the organometallic coating, and optionally applying a copper oxidation inhibitor at the same time.

The reduction and/or dissolution composition contains a reducer and/or dissolution agent, and optionally a copper oxidation inhibitor. Examples of reducers include, but are not limited to, DMAB (dimethylaminoborane), diethylaminoborane, morpholine borane and the like. Other suitable reducers include ammonium, alkali and/or alkaline earth metal borohydrides, hypophosphites, sulfites, bisulfites, hydrosulfites, metabisulfites, dithionates, tetrathionates, thiosulfates, thioureas, hydrazines, hydroxylamines, aldehydes (including formaldehyde and glyoxal), glyoxylic acid and reducing sugars. Electric current may be used as well.

Dissolution agents employed may include any of the known cupric ion chelators (complexors), organic or inorganic acids and/or their salts, (or a combination of them), can be utilized for the present application. Such dissolution agents include, but are not limited to, EDTA (ethylenediamine-tetracetatic acid), HEEDTA, NTA, DTPA, DCTA, Quadrol(V (ethoxylated/propoxylated ethylene diamine derivative available from BASF), organic phosphates (Dequests), organic acids (citric, tartaric, gluconic, glutamic, sulfamic, glycolic, glycine, malic, maleic, salicylic, ascorbic, formic, and the like), inorganic acids (hydrochloric, hydrofluoric, hydrobromic, nitric, chromic acids, and the like), and/or their ammonium hydroxide, pyrophosphates, and the like. Quadrol®, EDTA and phosphanates are preferred. Additionally, it may be advantageous to use the dissolution agents with one or more reducing agents.

Suitable oxidation inhibitors or corrosion inhibitors are disclosed above. Cationic, amphoteric, anionic and/or non-ionic surfactants may also be utilized in the adhesion-promoting solution to enhance the effectiveness of the adhesion-promoting solution.

Proper pH, temperature, concentrations of components as well as treatment time are adjusted appropriately to insure effective reduction and/or dissolution of the cupric ion as disclosed in WO 00-02426 (PCT/US99/14983) published Jan. 13, 2000 (Applicant: Alpha Metals Inc.), the entire disclosure of which is hereby incorporated in its entirety by reference.

After the cupric-based organometallic compounds on the copper surface is converted into cuprous-based organometallic compounds by reduction and/or dissolution, the copper is post-treated with the aqueous wetting solution. The copper surface may be rinsed with water before and/or after the post-treatment followed by placing the polymer material on the copper surface.

The following examples further describes the process and composition of the present invention, however, the examples are not intended to limit the scope of the invention.

EXAMPLE 1

The following example shows improved adhesion between copper surfaces and polymeric materials after the copper surfaces were treated with the post-treatment aqueous organo-silicon composition of the present invention. Adhesion between the copper surfaces and the polymeric materials was measured by peel strength using a standard Instron Peel Tester®, model #2530-437.

Thirteen 30.5 cm×30.5 cm RTF® copper foils each having a thickness of about 4 mm were employed. Each copper foil was treated with an aqueous adhesion-promoting solution of Circubond® Treatment 180 bath formulation (obtainable from Shipley Company, Marlborough, Mass.). The composition of the Circubond® Treatment 180 bath formulation is given below:

| | |
|---|---|
| Sulfuric acid (50%) | 9% by Volume |
| Hydrogen Peroxide (35%) | 3.5% by Volume |
| Benzotriazole | 9 gr/l |
| Tetrabutylammonium chloride | 12–18 ppm |
| Water | Balance |

Treatment was provided for in a conveyorized flood machine. Each copper foil was exposed to the adhesion-promoting solution for about 60 seconds. The copper foils were then rinsed with deionized water. All the foils, except for the foil of sample 13 (control), were than post-treated with an organo-silicon aqueous composition. The aqueous organo-silicon composition employed in post-treatment was Dynasylan® Triamo (trimethoxysilyl-propyldiethylene-triamine) in concentrations of about 1%, 5%, or 10% by volume (see table below). The copper foils of samples 1–12 were dipped into the post-treatment compositions for about 60 or about 90 seconds at room temperature (about 20° C.) or at about 35° C. All of the foils were then pressed using Nelco® pre-preg (polyethylene polymer), one sheet of 7628, 4000 series and two sheets of 1080, 4000 series. The press was done using the Wabash® press standard press cycle of about 1 hour and 45 minutes.

Peel strength testing was then performed on the foils. The peel strength is the force measured in pounds per inch required to separate the foil from the pre-preg material. The results and data are given below:

| Sample No. | Organo-Silicon % by Volume | Time of Post-Treatment in Sec. | Temperature of Post-Dip in ° C. | Peel Strength (lbs/in) |
|---|---|---|---|---|
| 1 | 1 | 60 | 100 | 5.9 |
| 2 | 1 | 90 | 100 | 5.9 |
| 3 | 10 | 90 | 100 | 6.0 |
| 4 | 1 | 60 | 22 | 6.2 |
| 5 | 1 | 90 | 22 | 6.6 |
| 6 | 5 | 60 | 100 | 6.7 |
| 7 | 5 | 60 | 22 | 6.9 |
| 8 | 5 | 90 | 100 | 7.0 |
| 9 | 5 | 90 | 22 | 7.5 |
| 10 | 10 | 60 | 100 | 7.7 |
| 11 | 10 | 90 | 22 | 8.0 |
| 12 | 10 | 60 | 22 | 8.1 |
| 13 | 0 | 0 | 0 | 5.7 |

The data show that post-treatment of an adhesion-promoting solution with an aqueous organo-silicon composition of the present invention improves adhesion between a copper surface and a polymer material. The peel strength for the control sample was 5.7 lbs/in. In contrast, the peel strengths for all the other copper foils had peel strengths of 5.9 lbs/in to as high as 8.1 lbs/in. The best results were obtained where the post-treatment composition concentration was about 10% by volume with a dwell time of about 60 seconds at room temperature.

EXAMPLE 2

The following test was to confirm that the 10% by volume aqueous organo-silane post-treatment at room temperature without rinsing gave the better peel strength results.

Five copper foils as employed in Example 1 were treated with Circubond® 180 Treatment bath formulation using a conveyorized flood machine. Each copper foil was treated with the Circubond® 180 for about 60 seconds. After the treatment, foil samples 2 and 3 were rinsed with deionized water. All of the samples except for sample 1 (control) were dipped in a 10% by volume solution of Dynasylan® Triamo (trimethoxysilyl-propyldiethylene-triamine) for about 60 seconds. Samples 2 and 3 were rinsed with deionized water, and all the samples except sample 1 were air-dried. Samples 3 and 5 were baked in a convection oven at about 100° C. for about 10 minutes. Each copper foil was then pressed using Nelco® pre-preg as disclosed in Example 1. The peel strength was then determined using the Instron® Peel Tester. The data and results are given in the table below.

| Sample No. | Rinse Deionized Water | Post-Treatment 10% Silane | Rinse Deionized Water | Air Dry at Room Temp. | Bake at 100° C. for 10 min. | Peel Strength (lbs/in) |
|---|---|---|---|---|---|---|
| 1 (control) | NO | NO | NO | NO | NO | 5.7 |
| 2 | YES | YES | YES | YES | NO | 6.7 |
| 3 | YES | YES | YES | YES | YES | 6.4 |
| 4 | NO | YES | NO | YES | NO | 8.7 |
| 5 | NO | YES | NO | YES | YES | 7.5 |

The results show that copper foils that were not rinsed before or after post-treatment had the best peel strengths. The control had the worst peel strength. Sample 4, which was not rinsed nor baked, had the best peel strength of about 8.7 lbs/in. Sample 5 had the next highest of about 7.5 lbs/in. Although sample 5 was not rinsed, the sample was baked. Accordingly, to achieve optimum results the metal surface preferably is not rinsed nor baked during the process of the invention.

EXAMPLE 3

The present example was performed to show that the post-treatment composition and method of the present invention prevents tack problems between metal surfaces treated with adhesion promoting compositions.

Six copper foils having the dimensions as described in Example 1 above, were rinsed with Circubond® 140 cleaner formulation (obtainable from Shipley Company, Marlborough, Mass.) for about 60 seconds to remove light oxides, finger prints and light oils from the copper surfaces. All of the copper foils were then rinsed with deionized water for about 90 seconds. All the copper foils were treated with Circubond® 180 Treatment Formulation for about one minute in a conveyorized flood machine, and were post-treated with a 10% by volume Dynasylan® Triamo solution for about 60 seconds. All of the post-treated copper foils were air dried at about 20° C. Three of the copper foils were further baked at a temperature of about 100° C. in a convection oven for about 10 minutes.

The copper foils were stacked in pairs with their treated and post-treated surfaces face to face. One pair consisted of two foils that were not baked, one pair consisted of foils that were baked, and the third pair consisted of foils where one was baked and the other was not. Each pair was placed under 10 lbs of pressure and left over night (about 24 Hours).

The next day the copper foils readily separated from each other. There were no tack problems. Baking had no effect on the separation ability between the copper foils, or tack problems. The results showed that the post-treatment composition and method eliminates tack problems between metal surfaces treated with adhesion promoting compositions.

EXAMPLE 4

The present example is directed to showing that the post-treatment composition and method of the present invention works when employed in conjunction with metal surface treatment methods employed in the circuit board industry.

Twenty-eight copper foils having the dimensions disclosed in Example 1 were employed in this example. Fourteen of the copper foils were pre-etched with an aqueous slurry of pumice. The pumice removes any unwanted light oils, finger-prints and light oxides on the metal surfaces. The surfaces of the copper foils to be treated were spray cleaned with the pumice for about 10 seconds. The other fourteen copper foils were pre-etched with a mono-persulfate solution for about 10 seconds. The mono-persulfate pre-etch was employed to initiate etching. All 28 samples were then rinsed with deionized water for about 60 seconds, air dried at about 20° C. and rinsed for about 60 seconds with Circubond® 140 cleaner a 60 g/l of monoethanolamine (obtainable from Shipley Company, Marlborough, Mass.).

All 28 samples were then placed in a Circubond® 80 Treatment Formulation bath for about 60 seconds at room temperature (about 20° C.) to etch the copper surfaces. The depth that each copper foil surface was etched is shown in the table. Four of the copper foils were then post-treated with a 10% by volume Dynasylan® Triamo for about 60 seconds at room temperature. Four of the copper foils were post-treated with a 10% by volume polyethylene glycol solution (PEG) at about 37° C. for about 60 seconds. Four copper foils were post-treated with a 5% by volume of a solution of 345 g/l sodium hydroxide at room temperature for about 60 seconds. Twelve of the copper foils were not post-treated but functioned as controls.

After post-treatment, the foils were then pressed using three sheets of Dryclad® 2300 pre-preg (obtainable from IBM Inc., Rochester, N.Y.). The peel strength was performed on each foil using the Instron® Peel Tester, model No. 2530-437. The peel strengths for each copper foil are given below.

| Sample No. | Pre-etch | Post-Treatment | Etch (microinches) | Peel Strength (lbs/in) | Peel Strength Controls (lbs/in) |
| --- | --- | --- | --- | --- | --- |
| 1 | Pumice | Silane | 65 | 1.7 | 1.0 |
| 2 | Pumice | Silane | 90 | 2.0 | 1.1 |
| 3 | Pumice | PEG | 65 | 0.7 | 0.1 |
| 4 | Pumice | PEG | 90 | 1.1 | 0.2 |
| 5 | Pumice | 345 g/l NaOH | 65 | 1.5 | 0.9 |
| 6 | Pumice | 345 g/l NaOH | 90 | 2.0 | 1.1 |
| 7 | persulfate | Silane | 65 | 2.0 | 1.3 |
| 8 | persulfate | Silane | 90 | 2.2 | 1.3 |
| 9 | persulfate | PEG | 65 | 0.7 | 0.0 |
| 10 | persulfate | PEG | 90 | 0.9 | 0.0 |
| 11 | persulfate | 345 g/l NaOH | 65 | 1.7 | 2.0 |
| 12 | persulfate | 345 g/l NaOH | 90 | 1.8 | 0.9 |
| 13 | Pumice | | 65 | | 0.6 |
| 14 | 345 g/l NaOH | | 65 | | 0.7 |
| 15 | Pumice | | 90 | | 0.8 |
| 16 | 345 g/l NaOH | | 90 | | 0.9 |

The results show that overall the copper foils post-treated with the organo-silicon aqueous composition had the highest peel strengths. The highest peel strength was 2.2 lbs/in in sample 8 where the copper foil was post-treated with Silane. All of the Control samples were below 2.2 lbs/in (see table). Although post-treatment with sodium hydroxide had peel strengths as high as 2.0 lbs/in (sample 6) which matched silane in samples 2 and 7, silane was still the preferred post-treatment composition because sodium hydroxide can result in corrosion of the polymeric material. Thus, the post-treatment composition of the present invention improves the integrity of the adhesion of polymeric material in contrast to copper foils not treated with an organo-silicon aqueous composition.

EXAMPLE 5

The present example as in Example 4 above was done to show that the silane compositions of the present invention work in conjunction with metal surface treatment processes used in the circuit board manufacturing industry.

The procedure of testing the peel strength of post-treatment copper foils and control copper foils was the same as in Example 6 except that all of the copper foils were pre-etched with mono-persulfate. After pre-etching, 14 copper foils were pre-dipped in a solution of 1 g/l of benztriazole, 2 g/l (50%) $H_2SO_4$, 3% by weight of hydrogen peroxide at room temperature for about 60 seconds to initiate etch. All the copper foils were etched with Circubond® 180 adhesion promoting composition for about 60 seconds. Each copper foil was etched to a depth of about 80 microinches. All of the copper foils were then post-treated with post-treatment solutions as disclosed in the table below except for 15 of the copper foils listed under Control in the table.

| Sample No. | Pre-Dip | Post-Treat. Composition | Post-Treat. Temp. | Peel Strength (lbs/in) | Peel Strength (lbs/in) Cont. |
|---|---|---|---|---|---|
| 1 | NO | Silane | 20° C. | 2.2 | 1.5 |
| 2 | NO | 5% (345 g/l) NaOH | 20° C. | 1.5 | 0.8 |
| 3 | NO | 10% (345 g/l) NaOH | 20° C. | 1.4 | 0.7 |
| 4 | NO | 20% (345 g/l) NaOH | 20° C. | 1.6 | 0.9 |
| 5 | NO | None | | 0.7 | |
| 6 | YES | Silane | 20° C. | 1.7 | 1.0 |
| 7 | YES | 5% (345 g/l) NaOH | 20° C. | 1.7 | 1.0 |
| 8 | YES | 10% (345 g/l) NaOH | 20° C. | 1.8 | 1.1 |
| 9 | YES | 20% (345 g/l) NaOH | 20° C. | 2.0 | 1.3 |
| 10 | NO | 5% (345 g/l) NaOH | 37° C. | 1.6 | 0.9 |
| 11 | NO | 10% (345 g/l) NaOH | 37° C. | 1.6 | 1.0 |
| 12 | NO | 20% (345 g/l) NaOH | 37° C. | 1.7 | 1.0 |
| 13 | YES | 5% (345 g/l) NaOH | 37° C. | | |
| 14 | YES | 10% (345 g/l) NaOH | 37° C. | | |
| 15 | YES | 20% (345 g/l) NaOH | 37° C. | 1.9 | 1.2 |
| 16 | NO | None | 37° C. | | 0.8 |

Sixteen of the copper foils were post-treated at room temperature and 13 of the copper foils were post-treated at temperatures of about 37° C. for about 60 seconds.

Each copper foil was then coated with the IBM pre-preg as in Example 4. The peel strength of each sample was determined as shown in the table. The copper foils post-treated with 10% by volume of Dynasylan® Triamo had the highest peel strength of about 2.2 lbs/in (Sample 1). Although some of the sodium hydroxide treated samples had peel strengths equal to (samples 7 and 12) or superior to (samples 8, 9, 13 and 15) the peel strength of silane in sample 6 (1.7 lbs/in), the organo-silane aqueous post-treatment of the present invention is still preferred because the harsh sodium hydroxide can cause polymer corrosion. Also, the peel strength of the post-treated copper foil is still superior to any of the control peel strengths as shown in the table. The highest peel strength for a control sample was 1.5 lbs/in. Thus the organo-silicon post-treatment composition of the present invention improves the integrity of adhesion between a copper surface and a polymeric material.

EXAMPLE 6

Seventy-two copper foils having the dimensions disclosed in Example 1 above were tested for their peel strength after post-treatment with post-treatment compositions as disclosed in the tables below.

All of the copper foils were treated with Circubond® 140 cleaner for about 60 seconds and rinsed with deionized water for about 90 seconds. Each copper foil was then etched with Circubond® 180 for about 60 seconds and rinsed with deionized water for about 90 seconds. All of the copper foils were post-treated with specific post-treatment compositions as indicated in the tables below except for six control samples. Post-treatment lasted for about 60 seconds. After the post-treatment procedure, some of the copper foils were rinsed with deionized water for about 60 seconds as indicated in the tables. All of the copper foils were pressed with Nelco® as described in Example 1 above. Peel strength was determined using the Instron® Peel Tester as in the examples above.

| Control Sample | Peel Strength (lbs/in) Rinse | Peel Strength (lbs/in) No Rinse | |
|---|---|---|---|
| 1 | 6.5 | 6.5 | 7.0 |
| 2 | 6.8 | 6.5 | 6.3 |
| Average | 6.6 | 6.5 | 6.6 |

| Silane 10% by Volume | Peel Strength (lbs/in) Rinse | Peel Strength (lbs/in) No Rinse |
|---|---|---|
| 3 | 7.0 | 9.1 |
| 4 | 7.2 | 9.3 |
| Average | 7.1 | 9.2 |

| Silane 5% by Volume + 5 g/l NaOH Pellets | Peel Strength (lbs/in) Rinse | Peel Strength (lbs/in) No Rinse |
|---|---|---|
| 5 | 6.8 | 8.2 |
| 6 | 6.6 | 8.0 |
| Average | 6.7 | 8.1 |

| Silane 5% by Volume + 20 g/l NaOH Pellets | Peel Strength (lbs/in) Rinse | Peel Strength (lbs/in) No Rinse |
|---|---|---|
| 7 | 7.6 | 8.9 |
| 8 | 7.2 | 9.1 |
| Average | 7.4 | 9.0 |

| Silane 5% by Volume + 5 g/l Sodium Carbonate | Peel Strength (lbs/in) Rinse | Peel Strength (lbs/in) No Rinse |
|---|---|---|
| 9 | 7.3 | 7.2 |
| 10 | 7.5 | 7.2 |
| Average | 7.4 | 7.2 |
| 7.4 | 7.2 | |

| Silane 5% By Volume | Peel Strength (lbs/in) Rinse | Peel Strength (lbs/in) No Rinse |
|---|---|---|
| 11 | 7.7 | 8.9 |
| 12 | 7.6 | 8.3 |
| 13 | 7.0 | 8.9 |
| 14 | 7.3 | 8.4 |
| Average | 7.4 | 8.6 |

| Silane 5% by Volume + 20 g/l Sodium Carbonate | Peel Strength (lbs/in) Rinse | Peel Strength (lbs/in) No Rinse |
|---|---|---|
| 15 | 7.3 | 8.3 |
| 16 | 7.1 | 8.6 |
| Average | 7.2 | 8.4 |

| Silane 5% by Volume + 5% Sodium Bicarbonate | Peel Strength (lbs/in) Rinse | Peel Strength (lbs/in) No Rinse |
|---|---|---|
| 17 | 7.4 | 8.9 |
| 18 | 7.1 | 8.1 |
| Average | 7.3 | 8.5 |

-continued

| Silane 5% by Volume + 20 g/l Sodium Bicarbonate | Peel Strength (lbs/in) Rinse | Peel Strength (lbs/in) No Rinse |
|---|---|---|
| 19 | 6.8 | 9.0 |
| 20 | 6.8 | 8.4 |
| Average | 6.8 | 8.7 |

| Silane 5% by Volume + 10% By Volume (2 g/l) PEG | Peel Strength (lbs/in) Rinse | Peel Strength (lbs/in) No Rinse |
|---|---|---|
| 21 | 7.5 | X |
| 22 | 6.7 | X |
| Average | 7.1 | X |

| Silane 10% by Volume, pH 7.0 | Peel Strength (lbs/in) Rinse | Peel Strength (lbs/in) No Rinse |
|---|---|---|
| 23 | 6.5 | 6.5 |
| 24 | 6.1 | 6.6 |
| Average | 6.3 | 6.5 |

| 20 g/l of Sodium Hydroxide | Peel Strength (lbs/in) Rinse |
|---|---|
| 25 | 8.3 |
| 26 | 7.6 |
| 27 | 7.1 |
| 28 | 7.6 |
| Average | 7.6 |

| Silane 5% by Volume + 1% by weight bisphenol-A epoxy | Peel Strength (lbs/in) Rinse | Peel Strength (lbs/in) No Rinse |
|---|---|---|
| 29 | 7.5 | 8.4 |
| 30 | 7.7 | 7.9 |
| Average | 7.6 | 8.2 |

| Silane 5% by Volume + 5% by weight bisphenol-A epoxy | Peel Strength (lbs/in) Rinse | Peel Strength (lbs/in) No Rinse |
|---|---|---|
| 31 | 7.3 | 8.3 |
| 32 | 8.1 | 8.9 |
| Average | 7.7 | 8.6 |

| 20 g/l Sodium Bicarbonate | Peel Strength (lbs/in) Rinse | Peel Strength (lbs/in) No Rinse |
|---|---|---|
| 33 | 6.2 | 5.9 |
| 34 | 6.1 | 5.9 |
| Average | 6.1 | 5.9 |

| 20 g/l Sodium Carbonate | Peel Strength (lbs/in) Rinse | Peel Strength (lbs/in) No Rinse |
|---|---|---|
| 35 | 6.4 | 6.2 |
| 36 | 6.9 | 6.0 |
| Average | 6.7 | 6.1 |

| Silane 1% by Volume + 5% by weight bisphenol-A epoxy | Peel Strength (lbs/in) Rinse | Peel Strength (lbs/in) No Rinse |
|---|---|---|
| 37 | 6.6 | X |
| 38 | 6.5 | X |
| Average | 6.5 | X |

| Silane 10% by Volume + 5% by weight bisphenol-A epoxy | Peel Strength (lbs/in) Rinse | Peel Strength (lbs/in) No Rinse |
|---|---|---|
| 39 | 6.3 | X |
| 40 | 6.3 | X |
| Average | 6.3 | X |

The results show that the highest peel strengths were obtained by a 10% by volume organo-silicon composition without a rinse step as shown in samples 3 and 4. The average peel strength for the no rinse was 9.2 lbs/in. The 5% by volume silane post-treatment composition of samples 11 to 14 had a peel strength of 7.4 lbs/in after rinsing and a peel strength of 8.6 lbs/in without rinsing. The average for the controls was about 6.6 lbs/in. Thus the post-treatment composition and method of the present invention significantly improves peel strength between an abrasion promotion treated copper surface and a polymeric material. The pH of the 10% and 5% silane post-treatment compositions were about 8.0.

Samples 5–10, and 15–20 contained sodium carbonate, sodium carbonate of sodium hydroxide in addition to silane as indicated in the tables below. The bases were added to the post-treatment compositions to raise the pH of the composition to determine the pH affect on peel strength. The pH of the base added compositions was about 13 or above.

Samples 7 and 8 which contained 5% silane and 20 g/l of sodium hydroxide had the highest average peel strength of the base containing post-treatment compositions. The peel strength was 9.0 lbs/in (no-rinse) Sodium hydroxide alone, as shown in samples 25–28 had an average peel strength of 7.6 lbs/in. (rinse). The pH of the sodium hydroxide composition was about 13 or higher.

Sodium carbonate in combination with silane had a high average peel strength of 8.4 lbs/in (samples 15 and 16). Sodium bicarbonate in combination with silane had a high average peel strength of 8.7 lbs/in (samples 19 and 20). Alone sodium carbonate had an average peel strength of 6.7 lbs/in (rinse), and sodium bicarbonate had an average peel strength of 6.1 lbs/in (rinse). The bicarbonate and carbonate compositions had pH values of over 13. Thus silane added to the post-treatment composition effects the peel strength more than raising the pH of the post-treatment composition.

Addition of a 10% by volume solution of 2 gm/l of polyethylene glycol (PEG) to a 5% by volume of silane did not improve the peel strength. The composition had a peel strength of 7.1 lbs/in (samples 21 and 22). The peel strength for a 5% by volume silane composition was 7.4 lbs/in (samples 11–14).

The addition of bisphenol-A epoxy resin to a 5% by volume silane composition also did not-significantly improve peel strength. Samples 29 and 30 which contained a 5% by volume silane and a 1% by weight bisphenol-A epoxy resin had a rinse peel strength of 7.6 lbs/in and a non-rinse peel strength of 8.2 lbs/in. Increaseing the bisphenol-A epoxy resin to 5% by weight as in samples 31 and 32 increased peel strength to only 7.7 lbs/in (rinse) and 8.6 lbs/in (no-rinse). When bisphenol-A epoxy resin was used alone as in samples 37 and 38, the average peel strength fell to 6.7 lbs/in. Thus silane was the primary component in the post-treatment compositions responsible for increasing peel strength.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patents and other publications cited herein are incorporated by reference in their entirety.

What is claimed is:

1. A method for treating a metal surface comprising:
    a) contacting the metal surface with an adhesion promotion composition to form a micro-roughened conversion coated metal surface, the adhesion promotion composition comprises a mixture of sulfuric acid and phosphoric acid, and a source of halide ions; and then
    b) contacting the micro-roughened conversion coated metal surface with an aqueous organo-silicon composition to prepare the metal surface for receiving a polymer material.

2. The method of claim 1, wherein the organo-silicon composition comprises an organosilane compound having the following formula:

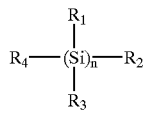

where n is 1 or 2, and where $R^1$, $R^2$, $R^3$, and $R^4$, are, each independently, an alkyl of from 1 to 20 carbon atoms, straight-chained, branched or cyclic, the alkyl group may be substituted with an alkenyl group of 2 to 8 carbon atoms, a halogen, thiol, cyano, isocyanato, an epoxy group, glycidyl group, an acryloxy group, a primary, secondary, tertiary, or quartanary amino group, or an aryl group, the aryl group may have alky substituents of from $C_1$ to $C_6$, $C_1$ to $C_6$ alkoxy, a halogen, or a hydroxyl group; an alkenyl group of from 2 to 20 carbon atoms, straight, branched or cyclic, unsubstituted or substituted with a halogen, thiol, cyano, isocyanato, or a primary, secondary or tertiary amino group; an aryl group unsubstituted, or substituted with a halogen, hydroxyl, or an alkyl group having from 1 to 6 carbon atoms, the alkyl group may be substituted with a halogen, thiol, or primary, secondary, or tertiary amino group; an alkoxy group having from 1 to 6 carbon atoms, unsubstituted or substituted with a halogen, thiol, aryl, or primary, secondary or tertiary amino group; an epoxy substituted alkyl having from 3 to 12 carbon atoms; an acetamido group having from 2 to 6 carbon atoms; an aceto group having from 2 to 6 carbon atoms; acetoxy group; an imadazole group; a hydroxyl group; or a primary, secondary or tertiary amino group.

3. The method of claim 2, wherein the organosilane compound comprises trimethoxysilyl-propylethylene-diamine, trimethoxysilyl-propylene-diamine, trimethoxysilyl-propyldiethylene-triamine, N-methylamino-propyltrimethoxysilane, 3-mercaptopropyltrimethoxysilane, 3-mercaptopropylmethyldimethoxysilane, 2-mercaptoethylmethyldiethoxysilane, isobutyl-trimethoxysilane, 3-isocaynatopropyl-triethoxysilane, 3-methacryloxy-propyltrimethoxysilane, N-methylamino-propyltrimethoxysilane, diphenyl-diethoxysilane, diphenyl-dimethoxysilane, 2-(3,4-epoxycyclohexyl)ethyl-trimethoxysilane, ethyl-triacetoxysilane, (3-gkycidooxypropyl-)-methyldiethoxysilane, 3-glycidopropypl-trimethoxysialne, chloromethyl-trimethylsilane, 3-chloropropyl-methyldimethoxysilane, 3-chloropropyl-triethoxysilane, 2-cyanoethyl-trimethoxysilane, di-t-butoxy-diacetoxysilane, hexamethyl-disilane, or mixtures thereof.

4. The method of claim 1, wherein the organo-silicon compound comprises an organosiloxane or organosilazane having the following formula:

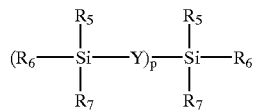

where p is 1 to 6, Y is O, or $NR_8$, where $R_8$ is H, $C_1$ to $C_8$ alkyl or phenyl; and where $R_5$, $R_6$, and $R_7$ are, each independently, an alkyl group having from 1 to 20 carbon atoms, branched, unbranched, or cyclic, unsubstituted or substituted with halogen, or thiol; an alkenyl group of from 1 to 20 carbon atoms, branched or unbranched, unsubstituted or substituted with a halogen or thiol group; an aryl group, unsubstituted or substituted with an alkyl group of from 1 to 6 carbon atoms, an alkoxy group or a halogen, or haydroxyl group.

5. The method of claim 4, wherein the organosiloxanes comprise hexamethyl-disiloxane, 1,3-diphenyl-1,3-dimethyldisiloxane, 1,1,3,3-tetraisopropyl-disiloxane, 1,3-divinyl-tetramethyldisiloxane, 1,1,3,3-tetramethyl disiloxane, 1,1,3,3,5,5-hexamethyl-trisiloxane, decamethyl-tetrasiloxane, hexamethyl cyclotrisiloxane, decamethylcyclopentasiloxane, 1,3,5,7,9-pentamethylhydrocyclopentasiloxane or mixtures thereof.

6. The method of claim 4, wherein the silazanes comprise hexamethyldisilazane, 1,3-diphenyltetramethyldisilizane, 1,3-divinyltetrarnethyldisilizane, 1,1,3,3,5,5-hexamethylcyclotrisilazane, octaniethylcyclotetrasilazane, or mixtures thereof.

7. The method of claim 1, wherein the organo-silicon compound comprises from about 0.5% by volume to about 25% by volume of the aqueous composition.

8. The method of claim 7, wherein the organo-silicon compound comprises from about 5% to about 15% by volume of the aqueous composition.

9. The method of claim 1, wherein the micro-roughened conversion coated metal surface is contacted with the aqueous organo-silicon composition for about 1.0 second to about one minute.

10. The method of claim 9, wherein the micro-roughened conversion coated metal surface is contacted with the aqueous organo-silicon composition for about 10 to about 30 seconds.

11. The method of claim 10, wherein the adhesion promotion composition further comprises an oxidizer, a corrosion inhibitor or mixtures thereof.

12. The method of claim 11, wherein the oxidizer comprises from about 0.1% to about 20% by weight of the adhesion promotion composition.

13. The method of claim 1, wherein the acid mixture comprises from about 5 to about 360 grams per liter of the adhesion promotion composition.

14. The method of claim 11, wherein the corrosion inhibitor comprises pyrroles, azoles, oxazoles, thiazoles, pyrazoles triazoles, benztriazoles, tetrazoles, tolyltriazoles, hydroxy-substituted azole compounds, imidazoles, benzimidazoles or mixtures thereof.

15. The method of claim 14, wherein the corrosion inhibitor comprises from about 0.1 to about 20% by weight of the adhesion promotion composition.

16. The method of claim 1, wherein the source of halide ions comprises sodium chloride, potassium chloride, sodium chlorate, potassium chlorate, hydrochloric acid or mixtures thereof.

17. The method of claim 11, further comprising a non-surfactant amine, a quaternary ammonium compound or mixtures thereof.

18. The method of claim 17, wherein the non-surfactant amines comprise primary, secondary or tertiary amines having $C_1$ to $C_8$ substitution.

19. The method of claim 17, wherein the amines and the quaternary ammonium compounds comprise from about 0.01% to about 2.5% by weight of the adhesion promotion composition.

20. The method of claim 11, wherein the adhesion promotion composition is free of surfactants.

21. The method of claim 1, further comprising the step of placing a polymeric material on the micro-roughened conversion coated metal surface after post-treatment of the metal surface with the aqueous organo-silicone composition.

22. The method of claim 1, wherein the metal surface is copper or a copper alloy.

23. A method for treating a metal surface comprising:
   a) contacting the metal surface with an adhesion promotion composition to form a micro-roughened conversion coating on the metal surface, the adhesion promotion composition comprises an oxidizer, a corrosion inhibitor, a source of halide ions and a mixture of sulfuric and phosphoric acid;
   b) contacting the mirco-roughened conversion coated metal surface with an alkaline composition; and then
   c) contacting the micro-roughened conversion coated metal surface with an aqueous organo-silicon wetting composition to prepare the micro-roughened conversion coated metal surface to receive a polymer material.

24. The method of claim 23, wherein the organo-silicon compounds comprise organosilanes having the following formula:

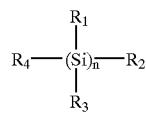

where n is 1 or 2, and where $R_1$, $R_2$, $R_3$, and $R_4$ are, each independently, an alkyl group of from 1 to 20 carbon atoms, straight-chained, branched or cyclic, the alkyl group may be substituted with an alkenyl of from 2 to 8 carbon atoms, a halogen, thiol, cyano, isocyanato group, an epoxy group, glycidyl group, an acryloxy group, a primary, secondary, tertiary, or quartenary amino group, or an aryl group, the aryl group may have alkyl substituents of $C_1$ to $C_6$, a $C_1$ to $C_6$ alkoxy, a halogen, or a hydroxyl group; an alkenyl group of from 2 to 20 carbon atoms, straight, branched, or cyclic, unsubstituted or subsituted with a halogen, thiol, cyano, isocyanato group, a primary, secondary, or tertiary amino group; an aryl group, unsubstituted or substituted with a halogen, hydroxyl, an alkyl group or alkoxy group having from 1 to 6 carbon atoms, the alkyl group may be substituted with a halogen, thiol, cyano, isocyanato, or a primary, secondary or tertiary amino group; an alkoxy group having from 1 to 6 carbon atoms, unsubstituted or substituted with a halogen, thiol, aryl, primary, secondary, or tertiary amino group; an epoxy substituted alkyl having from 3 to 12 carbon atoms; an acetamido group having from 2 to 6 carbon atoms; an aceto group having from 2 to 6 carbon atoms; an acetoxy group; an imidazole group; a hydroxyl group; or a primary, secondary, or tertiary amino group.

25. The method of claim 24, wherein the organosilane comprises trimethoxysilyl-propyldiethylenetriamine, 1-trimethoxysilyl-2(chloromethyl)-phenylethane, N-trimethoxysilyl-N,N,N-tri-methyl ammonium chloride, trimethylethoxy-silane, trimethylsilyl-acetamide, trimethylsilyl-acetate, trimethylsilyl-imidazole, isobytyl-trimethoxysilane, 3-isocyanatopropyl-triethoxysilane, 3-mercaptopropyl-trimethoxysilane, 3-methacryloxypropyl-methoxysilane, N-methylaminopropyl-trimethoxysilane, Diphenyl-diethoxysilane, diphenyl-dimethoxysilane, 2-(3,4-epxoycyclohexyl)ethyl-trimethoxysilane, ethyltriacetoxysilane, (3-glycidoxypropyl)-methyldiethoxysilane, 3-glycidoxypropyl-trimethoxysilane, chioromethyl-trimethylsilane, 3-chioropropyl-methyldimethoxysilane, 3-chloropropyl-trimethoxysilane, 3-chloropropyl-trimethoxysilane, 2-cyanoethyl-trimethoxysilane, di-t-butoxy-diactoxysilane, hexamethyl-disilane, diphenyl-silanediol, or mixtures thereof.

26. The method of claim 23, wherein the organo-silicon compound comprises organosiloxanes or organosilazanes having the following formula:

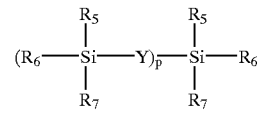

where p is 1 to 6, Y is O or $NR_8$; $R_8$ is H, $C_1$ to $C_8$ is alkyl, or phenyl; and where $R_5$, $R_6$, and $R_7$, are, each independently, an alkyl group having from 1 to 20 carbon atoms, branched, unbranched, or cyclic, unsubstituted or substituted with halogen, or thiol; an alkenyl group of from 1 to 20 carbon atoms, branched or unbranched, unsubstituted or substituted with a halogen or thiol group; an aryl group, unsubstituted or substituted with an alkyl group of from 1 to 6 carbon atoms, an alkoxy group or a halogen or hydroxyl group.

27. The method of claim 26, wherein the organosiloxanes comprise hexamethyl-disiloxane, 1,3-diphenyl-1,3-dimethyldisiloxane, 1,1,3,3-tetraisopropyl-disiloxane, 1,3-divinyl-tetramethyldisiloxane, 1,1,3,3-tetramethyl-disiloxane, 1,1,3,3,5,5-hexamethyl-trisiloxane, decamethyl-tetrasiloxane, hexamethylcyclotrisiloxane, decamethylcyclopentasiloxane, 1,3,5,7,9-pentamethylhydrocyclopentasiloxane.

28. The method of claim 26, wherein the organo-silazane comprises hexamethyldisilazane, 1,3-diphenyltetramethyldisilazne, 1,3-divinyltetramethyldisilizane, 1,1,3,3,5,5-hexamethylcyclotrisilazane, octamethylcyclotetrasilazane or mixtures thereof.

29. The method of claim 23, wherein the organo-silicon compound comprises from about 0.5% by volume to about 25% by volume of the aqueous organo-silicon composition.

30. The method of claim 23, wherein the oxidizer comprises hydrogen peroxide, persulfates, or mixtures thereof.

31. The method of claim 23, wherein the corrosion inhibitor comprises triazoles, benzotriazoles, imidazoles, benzimidazoles, tetrazoles or mixtures thereof.

32. The method of claim 23, further comprising the step of placing a polymer material on the micro-roughened conversion coated metal surface after contacting the metal surface with the organo-silicon aqueous composition.

33. A method of treating a metal surface comprising:
   a) contacting the metal surface with an adhesion promotion composition to form a micro-roughened conversion coated surface on the metal surface and to reduce the metal surface, the adhesion promotion composition comprises a reducer, dissolution agent, a source of halide ions and a mixture of sulfuric and phosphoric acid;
   b) contacting the micro-roughened and reduced metal surface with an aqueous organo-silicon composition to prepare the micro-roughened and reduced metal surface for receiving a polymeric material.

34. The method of claim 33, wherein the aqueous organo-silicon composition comprises organosilanes having the following formula:

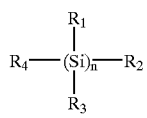

where n is 1 or 2, and where $R_1$, $R_2$, $R_3$, and $R_4$ are, each independently, an alkyl group of from 1 to 20 carbon atoms, straight-chained, branched or cyclic, the alkyl group may be substituted with an alkenyl group of from 2 to 8 carbon atoms, a halogen, thiol, cyano, isocyanato, an epoxy group, glycidyl group, an acryloxy group, a primary, secondary, tertiary or quartenary amino group, or an aryl group, the aryl group may have alkyl substituents of $C_1$ to $C_6$, a $C_1$ to $C_6$ alkoxy, a halogen or a hydroxyl group; an alkenyl group of from 2 to 20 carbon atoms, straight chained, branched, or cyclic, unsubstituted or substituted with a halogen, thiol, cyano, isocyanato, or a primary, secondary or tertiary amino group; an aryl group, unsubstituted or substituted with a halogen, hydroxyl, or an alkyl group having from 1 to 6 carbon atoms, the alkyl group may be substituted with a halogen, thiol, a primary, secondary, or tertiary amino group; an alkoxy group having from 1 to 6 carbon atoms, unsubstituted or substituted with a halogen, thiol, aryl, a primary, secondary, or tertiary amino group; an epoxy substituted alkyl having from 3 to 12 carbon atoms; an acetamido group having from 2 to 6 carbon atoms; an aceto group having from 2 to 6 carbon atoms; an acetoxy group; an imidazole group; a hydroxyl group; or a primary, secondary tertiary amino group.

35. The method of claim 34, wherein the organosilanes comprise amino-silanes, mercapto-silanes, alkyl-silanes, alkenyl-silanes, alkoxy-silanes or mixtures thereof.

36. The method of claim 33, wherein the aqueous organo-silicon composition comprises organosiloxanes or organosilazanes having the following formula:

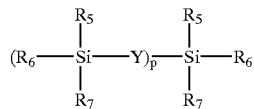

where p is 1 to 6, Y is O or $NR_8$; $R_8$ is H, $C_1$ to $C_8$ alkyl, or phenyl; and where $R_5$, $R_6$, and $R_7$, are, each independently, an alkyl group having from 1 to 20 carbon atoms, branched, unbranched, or cyclic, unsubstituted or substituted with halogen, or thiol; an alkenyl group of from 1 to 20 carbon atoms, branched, or unbranched, unsubstituted, or substituted with a halogen or thiol group; an aryl group, unsubstituted, or substituted with an alkyl group of from 1 to 6 carbon atoms, an alkoxy group or a halogen, or hydroxyl group.

37. The method of claim 36, wherein the organosiloxane comprises hexamethylcyclo-trisiloxane, hexamethyl-disiloxane, 1,3-divinyltetra-methyldisiloxane, decamethylcyclo-pentasiloxane, decamethyl-tetrasiloxane, or mixtures thereof.

38. The method of claim 36, wherein the organosilazane comprises 1,1,3,3,5,5-hexamethylcyclo-trisilazane, hexamethyldisilazane, or mixtures thereof.

39. The method of claim 33, wherein the aqueous organo-silicon composition comprises from about 0.5% to about 25% by volume of an organo-silicon compound.

40. The method of claim 33, wherein the reducer comprises aminoboranes, ammonium, alkali metal borohydrides, hypophosphites, alkaline earth metal borohydrides, alkaline earth metal hypophosphites, aldehydes, glycoxylic acid, reducing sugars, or mixtures thereof.

41. The method of claim 33, wherein the dissolution agents comprise EDTA, HEEDTA, NTA, DTPA, DCTA, ethoxylated/propoxylated ethylene diamine derivative, organic phosphanates, organic acids, inorganic acids, ammonium, amines, or mixtures thereof.

42. The method of claim 33, wherein the adhesion promotion composition further comprises a corrosion inhibitor.

43. The method of claim 42, wherein the corrosion inhibitor comprises azole, derivatives such as benzotriazole, tolyltriazole, or mixtures thereof.

44. The method of claim 33, further comprising the step of placing a polymeric material on the metal surface after treating the metal with the aqueous organo-silicon composition.

* * * * *